US009865810B2

(12) United States Patent
Park

(10) Patent No.: US 9,865,810 B2
(45) Date of Patent: Jan. 9, 2018

(54) ELECTRONIC DEVICE AND METHOD FOR FABRICATING THE SAME

(71) Applicant: SK hynix Inc., Icheon-Si (KR)

(72) Inventor: Ju-Bong Park, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 14 days.

(21) Appl. No.: 14/846,761

(22) Filed: Sep. 5, 2015

(65) Prior Publication Data

US 2016/0181520 A1 Jun. 23, 2016

(30) Foreign Application Priority Data

Dec. 17, 2014 (KR) ........................ 10-2014-0182569

(51) Int. Cl.
*H01L 45/00* (2006.01)
*H01L 43/02* (2006.01)
*G06F 12/0802* (2016.01)
*H01L 43/12* (2006.01)

(52) U.S. Cl.
CPC ...... *H01L 45/1253* (2013.01); *G06F 12/0802* (2013.01); *H01L 43/02* (2013.01); *H01L 43/12* (2013.01); *H01L 45/06* (2013.01); *H01L 45/08* (2013.01); *H01L 45/1233* (2013.01); *H01L 45/16* (2013.01); *G06F 2212/1016* (2013.01); *G06F 2212/1028* (2013.01); *G06F 2212/202* (2013.01); *G06F 2212/222* (2013.01)

(58) Field of Classification Search
CPC . H01L 45/1233; H01L 45/1253; H01L 43/02; H01L 43/08; H01L 43/12
See application file for complete search history.

(56) References Cited

U.S. PATENT DOCUMENTS

| 7,518,243 | B2* | 4/2009 | Tokumine | H01L 23/5222 |
| | | | | 257/750 |
| 8,390,124 | B2* | 3/2013 | Inoue | H01L 21/76807 |
| | | | | 257/107 |
| 8,796,659 | B2* | 8/2014 | Tada | C23C 16/0272 |
| | | | | 257/2 |
| 2004/0081841 | A1* | 4/2004 | Nakajima | B82Y 10/00 |
| | | | | 428/492 |
| 2007/0001311 | A1* | 1/2007 | Enda | H01L 21/76816 |
| | | | | 257/763 |
| 2007/0029676 | A1* | 2/2007 | Takaura | G11C 13/0004 |
| | | | | 257/758 |
| 2015/0194333 | A1* | 7/2015 | You | H01L 21/7682 |
| | | | | 438/619 |
| 2017/0054070 | A1* | 2/2017 | Bak | H01L 43/02 |

FOREIGN PATENT DOCUMENTS

KR 10-2005-0122643 A 12/2005
KR 10-2010-0122701 A 11/2010

* cited by examiner

*Primary Examiner* — Allison P Bernstein
(74) *Attorney, Agent, or Firm* — Perkins Coie LLP

(57) ABSTRACT

Provided is an electronic device including a semiconductor memory. The semiconductor memory may include: a substrate; a variable resistance element formed over the substrate; a top electrode formed over the variable resistance element; a barrier layer formed over the top electrode and including a groove; an interlayer dielectric layer formed over the substrate to have a layer structure in which the variable resistance element, the top electrode and the barrier layer are formed in the interlayer dielectric layer; and a metal wiring including a portion formed in the groove of the barrier layer.

19 Claims, 15 Drawing Sheets

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0182569, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of simplifying a process and improving the characteristic of a variable resistance element.

In one aspect, an electronic device is provided to include a semiconductor memory. The semiconductor memory may include: a substrate; a variable resistance element formed over the substrate; a top electrode formed over the variable resistance element; a barrier layer formed over the top electrode and including a groove; an interlayer dielectric layer formed over the substrate to have a layer structure in which the variable resistance element, the top electrode and the barrier layer are formed in the interlayer dielectric layer; and a metal wiring including a portion formed in the groove of the barrier layer.

Implementations of the above electronic device may include one or more the following.

The barrier layer surrounds a part of the sidewall and the bottom of the metal wiring. The metal wiring, in addition to the portion formed in the groove of the barrier layer, includes a second portion formed over the interlayer dielectric layer, and the barrier layer includes an extension protruding above the interlayer dielectric layer to surround sidewalls of the second portion of the metal wiring. The barrier layer comprises a metal layer. The barrier layer comprises tantalum, and the metal wiring comprises copper. The metal wiring, in addition to the portion formed in the groove of the barrier layer, includes a second portion formed over the interlayer dielectric layer, and the device further includes an insulating layer in which the second portion of the metal wiring is formed. The electronic device may further comprising an insulating layer formed over the interlayer dielectric layer and having an air gap around the metal wiring. The electronic device may further comprising a bottom electrode contact between the substrate and the variable resistance element. The electronic device may further comprising: a source line contact formed in the interlayer dielectric layer to be adjacent to the variable resistance element and the top electrode; another barrier layer formed in the interlayer dielectric layer over the source line contact, and having a groove; and another metal wiring including a portion formed in the groove of another barrier layer and including another portion formed over the interlayer dielectric layer.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, a method for fabricating an electronic device including a semiconductor memory, the method comprising: forming a variable resistance element over a substrate; burying a first interlayer dielectric layer between the variable resistance elements; burying a top electrode contact in a part of a contact hole formed through the first interlayer dielectric layer, such that the top electrode contact is in contact with the variable resistance element; forming a mold layer over the top electrode contact and the first interlayer dielectric layer; etching the mold layer to form a damascene structure; burying a metal wiring in the damascene structure; etching the mold layer to form a barrier layer on the sidewall and bottom of the metal wiring; and burying a second interlayer dielectric layer between the metal wirings.

In the other aspect, a method for fabricating an electronic device including a semiconductor memory, the method comprising: forming a first interlayer dielectric layer over a substrate, the first interlayer dielectric layer including a bottom electrode contact; forming a variable resistance element over the first interlayer dielectric layer such that the variable resistance element is in contact with the bottom electrode contact; burying a second interlayer dielectric layer between the variable resistance elements; burying a top electrode contact in a part of a contact hole formed through the second interlayer dielectric layer, such that the top electrode contact is in contact with the variable resistance element; burying a source line contact in a part of a contact hole formed through the first and second interlayer dielectric layers between the variable resistance elements, such that the source line contact is in contact with the substrate; forming a mold layer over the top electrode contact, the source line contact, and the second interlayer dielectric layer; etching the mold layer to form damascene structures; burying first and second metal wirings in the respective damascene structures; etching the mold layer to form a barrier layer on the sidewalls and bottoms of the first and second metal wirings; and burying a third interlayer dielectric layer between the first and second metal wirings.

In another aspect, an electronic device comprising a semiconductor memory including an array of unit cells, wherein each unit cell comprises: a substrate; a bottom electrode contact formed over the substrate through a first interlayer dielectric layer; variable resistance element formed over the first interlayer dielectric layer through a second interlayer dielectric layer, the variable resistance element being electrically coupled to the substrate through the bottom electrode contact and exhibiting different resistance states for storing data; a top electrode contact formed over the variable resistance element in the second interlayer dielectric layer; a metal wiring formed over the top electrode to be electrically coupled to the variable resistance element through the top electrode contact; and a barrier layer formed over the top electrode and surrounding at least a portion of the metal wiring.

Implementations of the above method may include one or more of the following.

The barrier layer is formed to surround the lower portion of the metal wiring. The barrier layer is formed to surround the entire metal wiring. The barrier layer has a variable thickness such that the top critical dimension of the metal wiring surrounded by the barrier layer is equal to the bottom critical dimension of the metal wiring surrounded by the barrier layer.

In another aspect, there is provided a method for fabricating an electronic device including a semiconductor memory. The method comprising: forming a first interlayer dielectric layer over a substrate; forming contact holes through the first interlayer dielectric layer; forming contact plugs to fill in corresponding parts of the contact holes; forming a mold layer over the contact plugs and the first interlayer dielectric layer; etching the mold layer to form damascene structures; forming metal wirings in the damascene structures; etching the mold layer to form barrier layers, each barrier layer forming on the sidewall and bottom of a corresponding metal wiring; and forming a second interlayer dielectric layer to fill spaces between the metal wirings.

Implementations of the above method may include one or more of the following.

The mold layer comprises a conductive material. The mold layer comprises a metal layer. The bottom surface of the damascene structure is positioned at a lower level than the top surface of the first interlayer dielectric layer. The etching of the mold layer includes performing a blanket etch process. The etching of the mold layer is performed such that the top surface of the barrier layer is positioned at the same level as the top surface of the first interlayer dielectric layer. The etching of the mold layer including inducing the mold layer to be re-deposited. The barrier layer surrounds at least a part of sidewalls of the metal wirings. The second interlayer dielectric layer has an air gap between the metal wirings. The mold layer includes a material capable of functioning as a seed layer of the metal wirings. The metal wirings include a material having a great etch selectivity with respect to the mold layer.

DETAILED DESCRIPTION

Figure 1:
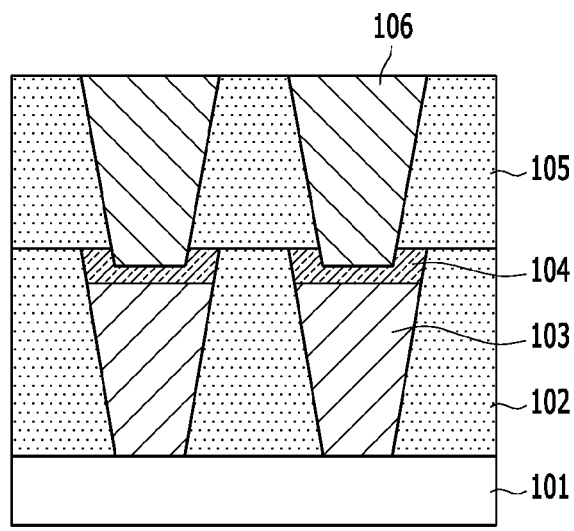
FIGS. 1 through 4 are cross-sectional views of exemplary semiconductor devices in accordance with first to fourth implementations.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIGS. 1 to 4 are cross-sectional views of exemplary semiconductor devices in accordance with first to fourth implementations.

As illustrated in FIG. 1, a semiconductor device in accordance with a first implementation may include a first interlayer dielectric layer 102, a contact hole (not illustrated), a contact plug 103, a barrier layer 104, a second interlayer dielectric layer 105, and a metal wiring 106. The first interlayer dielectric layer 102 may be formed over the substrate 101 having a predetermined structure formed therein. The contact hole may be formed through the first interlayer dielectric layer 102. The contact plug 103 may be buried in a part of the contact hole. The barrier layer 104 may be formed over the contact plug 103 and buried in the remaining part of the contact hole. The second interlayer dielectric layer 105 may be formed over the first interlayer dielectric layer 102 including the barrier layer. The metal wiring 106 may be formed through the second interlayer dielectric layer 105, and partially embedded in the barrier layer 104.

The contact plug 103, the barrier layer 104, and the metal wiring 106 may include a conductive material. For example, the conductive material may include a metal containing material. The contact plug 103 may include tungsten (W), for example. The metal wiring 106 may include copper (Cu), for example. The barrier layer 104 may serve as a diffusion barrier and a seed layer for forming the metal wiring 106.

The barrier layer 104 may be formed to cover some portion of the sidewalls of the metal wiring 106 as well as the bottom of the metal wiring 106. The barrier layer 104 may include tantalum (Ta), for example. In the first implementation, since the barrier layer 104 is locally formed only around the bottom portion of the metal wiring 106, it is possible to minimize the increase in resistance of the metal wiring caused by the thickness of the barrier layer.

Figure 2:
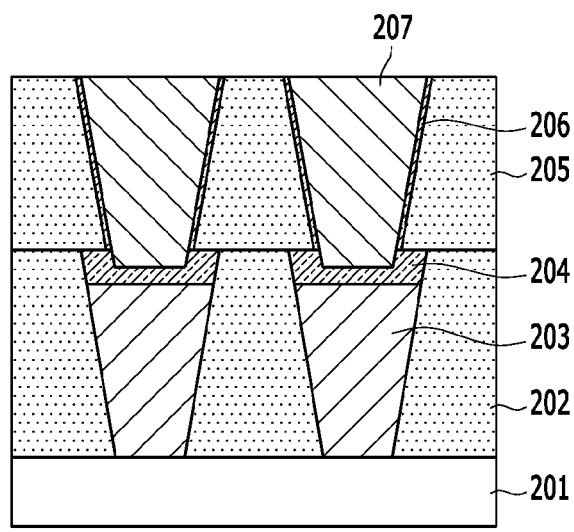

As illustrated in FIG. 2, a semiconductor device in accordance with a second implementation may include a first interlayer dielectric layer 202, a contact hole (not illustrated), a contact plug 203, a barrier layer 204 and 206, a second interlayer dielectric layer 205, and a metal wiring 207. The first interlayer dielectric layer 202 may be formed over the substrate 201 having a predetermined structure formed therein. The contact hole may be formed through the first interlayer dielectric layer 202. The contact plug 203 may be buried in a part of the contact hole. The barrier layer 204 and 206 may be formed over the contact plug 203 and buried in the remaining part of the contact hole. The second interlayer dielectric layer 205 may be formed over the first interlayer dielectric layer 202 including the barrier layer 204. The metal wiring 207 may be formed through the second interlayer dielectric layer 205, and partially embedded in the barrier layer 204.

The contact plug 203, the barrier layer 204 and 206, and the metal wiring 207 may be formed of or include the same material as those of the first implementation. In the second implementation, since the barrier layer 204 and 206 is formed on the sidewalls of the metal wiring 207 as well as the bottom portion of the metal wiring 207, it is possible to prevent a problem which may be caused due to diffusion between the adjacent metal wirings. Furthermore, since the barrier layer 206 formed on the sidewalls of the metal wiring has a smaller thickness than the barrier layer 204 formed at the bottom portion of the metal wiring, it is possible to minimize the increase in resistance of the metal wiring caused by the thickness of the barrier layer.

Figure 3:
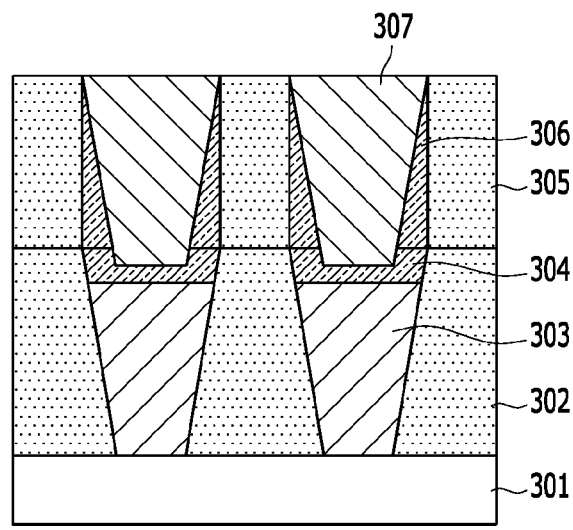

As illustrated in FIG. 3, a semiconductor device in accordance with a third implementation may include the same structure as that of FIG. 2. Reference numerals of FIG. 3 may represent the same regions as those of FIG. 2.

In the third implementation, the barrier layer 306 formed on the sidewalls of the metal wiring may have a thickness which gradually increases toward the bottom of the metal wiring 307. The thickness of the barrier layer 306 may be gradually increased in such a manner that the top critical dimension (CD) of the metal wiring including the barrier layer 306 is equal to the bottom CD of the metal wiring including the barrier layer 306. Please note that the area of the metal wiring does not decrease even with to the increase of the thickness of the barrier layer 306, while the thickness of the barrier layer 306 may increase along the slope of the metal wiring. Thus, it is possible to prevent diffusion of the metal wiring without an increase of resistance depending on the area of the metal wiring.

Figure 4:
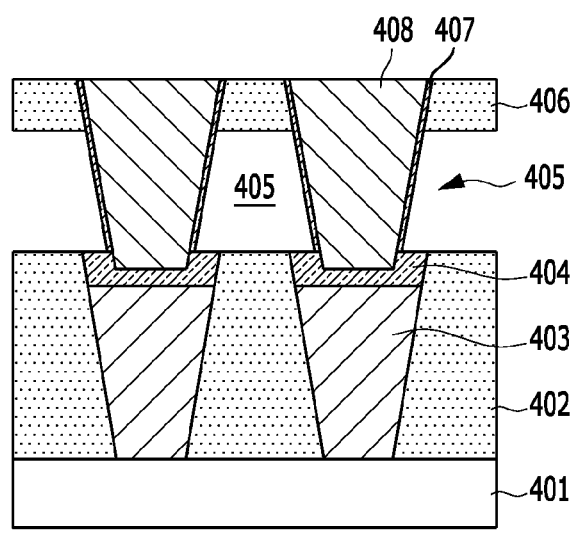

As illustrated in FIG. 4, a semiconductor device in accordance with a fourth implementation may include a first interlayer dielectric layer 402, a contact hole (not illustrated), a contact plug 403, a barrier layer 404 and 407, a metal wiring 408, and a second interlayer dielectric layer 406. The first interlayer dielectric layer 402 may be formed over the substrate 401 having a predetermined structure formed therein. The contact hole may be formed through the first interlayer dielectric layer 402. The contact plug 403 may be buried in a part of the contact hole. The barrier layer 404 and 407 may be formed over the contact plug 403 and buried in the remaining part of the contact hole. The metal wiring 408 may be partially embedded in the barrier layer 404. The second interlayer dielectric layer 406 may include an air gap between the metal wirings 408.

In the fourth implementation, the barrier layer 407 formed on the sidewalls of the metal wiring may have the same structure as that of FIG. 2. However, other implementations are also possible. For example, the barrier layer 407 may have the same structure as that of FIG. 1 or 3.

In the fourth implementation, since the second interlayer dielectric layer 406 includes the air gap 405 between the adjacent metal wirings 408, the insulation between the metal wirings 408 may be improved.

FIGS. 5A to 5F are cross-sectional views illustrating an example of a method for fabricating the semiconductor device in accordance with the first implementation. FIGS. 5A to 5F illustrate the method for fabricating the semiconductor device in accordance with the first implementation as shown in FIG. 1. However, the semiconductor devices having the barrier layer structure in accordance with the second to fourth implementations those are shown in FIGS. 2 to 4 can be formed through the same method.

Figure 5A:
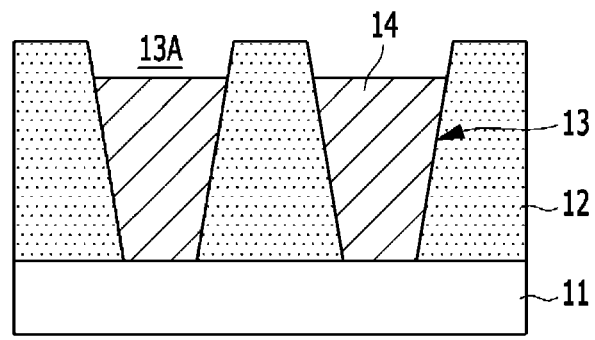
FIGS. 5A through 5F are cross-sectional views illustrating an example of a method for fabricating the semiconductor device in accordance with the first implementation.

As illustrated in FIG. 5A, a first interlayer dielectric layer 12 may be formed over a substrate 11. The substrate 11 may include a semiconductor substrate.

The first interlayer dielectric layer 12 may include an insulating material. The first interlayer dielectric layer 12 may include any one single layer including oxide, nitride, or oxynitride or a stacked structure thereof.

Then, a contact hole 13 may be formed to expose portions of the substrate 11 through the first interlayer dielectric layer 12.

Then, a contact plug 14 may be buried in a part of the contact hole 13. The contact plug 14 may include a conductive material. The contact plug 14 may include tungsten (W), for example. The contact plug 14 may be formed through the following series of processes: a conductive material is buried in the contact hole 13, a planarization process is performed to expose the first interlayer dielectric layer 12 such that the adjacent conductive materials are isolated from each other, and a part of the conductive material is recessed to form a groove 13A at the top of the conductive material. The planarization process may include a chemical mechanical polishing process or etch-back process, for example. Furthermore, the etching process may be performed under a condition of maximizing an etch selectivity between the conductive material and the insulating material, such that the damage of the first interlayer dielectric layer 12 is minimized during the process of forming the groove 13A.

Figure 5B:
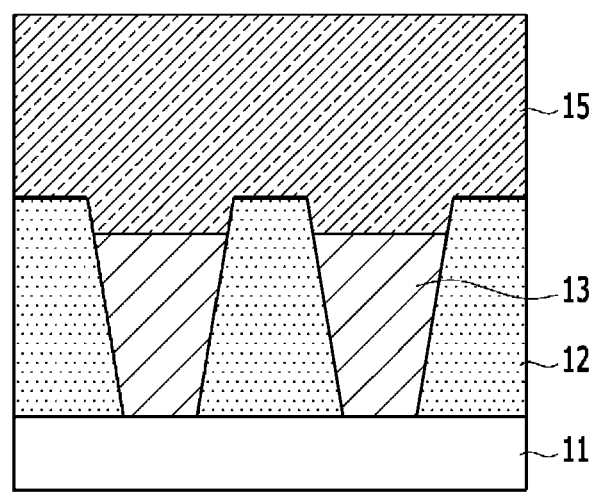

As illustrated in FIG. 5B, a mold layer 15 may be formed over the first interlayer dielectric layer 12 and the contact plug 14. The mold layer 15 may be formed to perform a damascene process for forming a metal wiring during a subsequent process. In the present implementation, since a material capable of serving as a seed layer of the metal wiring is used for the mold layer 15, an additional process for forming a barrier layer can be omitted, thereby increasing a process margin. Furthermore, since a barrier layer is not additionally formed after a damascene structure is formed, it is possible to prevent the reduction in CD of the metal wiring depending on the thickness of the barrier layer and the increase in resistance of the metal wiring.

The mold layer 15 may include a conductive material. The mold layer 15 may include tantalum (Ta), for example. The mold layer 15 may not only serve as a sacrificial layer for forming a damascene structure, but also serve as a seed layer during a metal wiring deposition process and a barrier layer for preventing diffusion of the metal wiring.

Figure 5C:
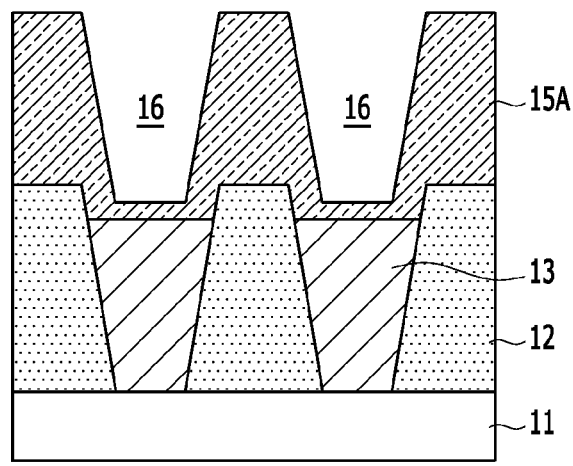

As illustrated in FIG. 5C, the mold layer 15 (refer to FIG. 5B) may be etched to form a damascene structure 16. The etched mold layer will be represented by reference numeral 15A. In the present implementation, the etching target may be adjusted such that the bottom surface of the damascene structure 16 is positioned at a lower level than the top surface of the first interlayer dielectric layer 12.

Figure 5D:
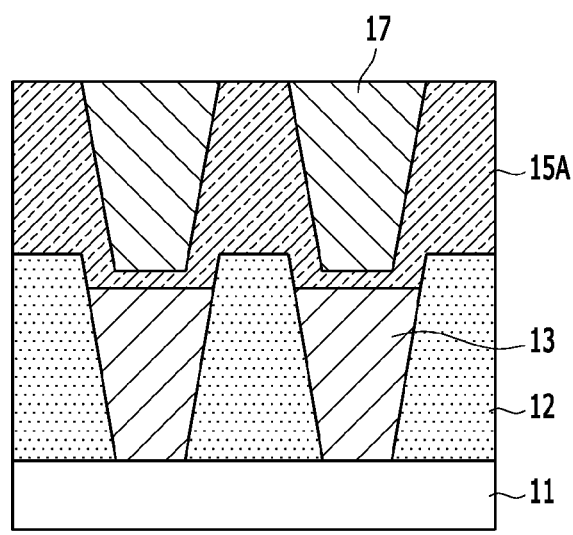

As illustrated in FIG. 5D, a metal wiring 17 may be buried in the damascene structure 16. The metal wiring 17 may be formed through the following series of processes: a conductive material is formed on the surface of the resultant structure so as to fill the damascene structure 16, and the adjacent metal wirings 17 are electrically isolated from each other. The isolation process may be performed by etching or polishing the conductive material formed on the surface using a blanket etch process (for example, etch-back process) or a chemical mechanical polishing process, until the mold layer 15A is exposed. The metal wiring 17 may include a conductive material. The metal wiring 17 may include copper (Cu), for example. Since the mold layer 15A serves as a seed layer when the metal wiring 17 is formed, the deposition process can be easily performed. Furthermore, since the mold layer 15A serves as a seed layer, a seed layer can be omitted when the metal wiring 17 is formed. Thus, a process margin can be secured. In addition, since the metal wiring 17 is buried in the entire damascene structure 16, it is possible to prevent the decrease of resistance depending on the area (CD) of the metal wiring 17.

Figure 5E:
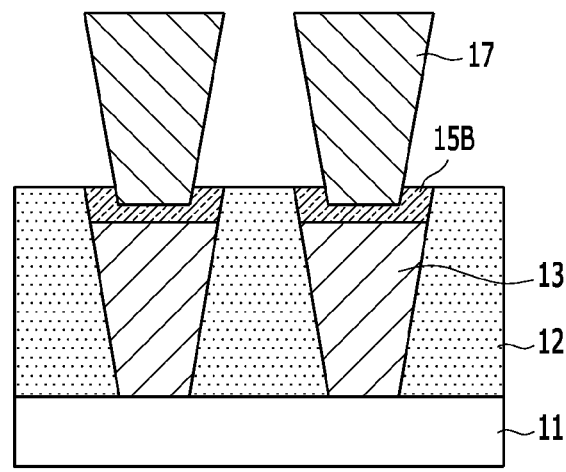

As illustrated in FIG. 5E, the mold layer 15A (refer to FIG. 5D) may be etched to form a barrier layer 15B. At this time, the etching target may be adjusted to such an extent that the top surface of the barrier layer 15B is positioned at the same level as the top surface of the first interlayer dielectric layer 12. Since the metal wiring 17 has a structure that protrudes in a pillar shape and is partially embedded in the barrier layer 15B, the etching process can be stably performed while a collapse is prevented.

Since Cu applied as the metal wiring 17 is a material having a great etch selectivity with respect to the mold layer, the metal wiring 17 is hardly damaged when the mold layer is etched. Thus, without a mask process, the mold layer can be sufficiently etched through an etch-back process. Furthermore, since the barrier layer 15B does not reduce the region of the metal wiring 17, it is possible to minimize the decrease in resistance of the metal wiring 17 due to the barrier layer 15B.

In the second implementation as discussed with regard to FIG. 2, when the mold layer is etched, the etched material may be induced to be re-deposited. Thus, as illustrated in FIG. 2, the barrier layer 206 may also be formed on the sidewalls of the metal wiring. Furthermore, in the third implementation as discussed with regard to FIG. 3, when the mold layer is etched, the metal wiring may be applied as an etch mask to form the barrier layer 306 having a thickness which gradually increases toward the bottom.

Figure 5F:
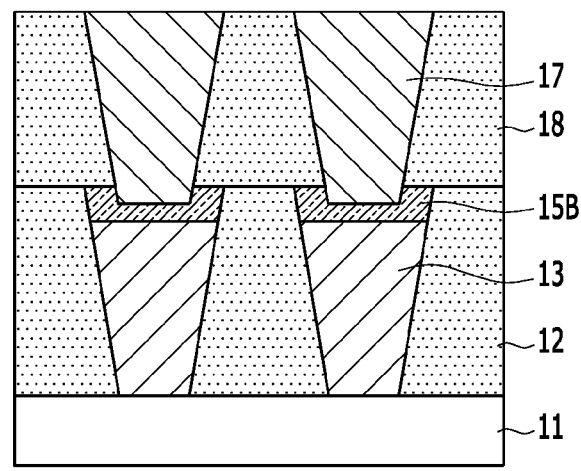

As illustrated in FIG. 5F, a second interlayer dielectric layer 18 may be buried between the metal wirings 17. The second interlayer dielectric layer 18 may include the same material as the first interlayer dielectric layer 12. The second interlayer dielectric layer 18 may include an insulating material. The second interlayer dielectric layer 18 may include any single layer including oxide, nitride, or oxynitride or a stacked structure thereof.

In the fourth implementation as discussed with reference to FIG. 4, when the second interlayer dielectric layer 406 is formed, a material having poor step coverage may be used to form an air gap 405 between the metal wirings 408.

Figure 6:
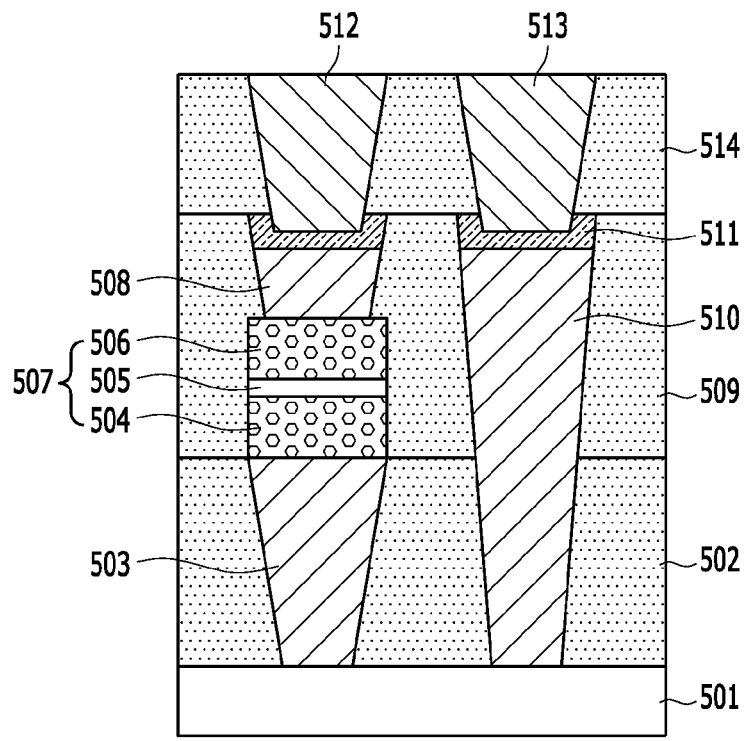
FIG. 6 is a cross-sectional view of an exemplary semiconductor device in accordance with a fifth implementation.

FIG. 6 is a cross-sectional view of an exemplary semiconductor device in accordance with a fifth implementation.

As illustrated in FIG. 6, the semiconductor device in accordance with the fifth implementation may include a first interlayer dielectric layer 502, a bottom electrode contact 503, a variable resistance element 507, a top electrode contact 508, a second interlayer dielectric layer 509, a source line contact 510, a barrier layer 511, first and second metal wirings 512 and 513, and a third interlayer dielectric layer 514. The first interlayer dielectric layer 502 may be formed over a substrate 501 having a predetermined structure formed therein. The bottom electrode contact 503 may be formed through the first interlayer dielectric layer 502 so as to be in contact with the substrate 501. The variable resistance element 507 may be formed over the bottom electrode contact 503. The top electrode contact 508 may be formed to be in contact with the variable resistance element 507. The second interlayer dielectric layer 509 may be buried in spaces between adjacent variable resistance elements 507 and in spaces between adjacent top electrode contacts 508. The source line contact 510 may be formed through the first and second dielectric layers 502 and 509 between the variable resistance elements 507 so as to be in contact with the substrate. The barrier layer 511 may be formed over the top electrode contact 508 and the source line contact 510. The first and second metal wirings 512 and 513 may be partially embedded in the respective barrier layers 511. The third interlayer dielectric layer 514 may be buried between the metal wirings 512 and 513.

The predetermined structure may include various access elements for controlling the supply of voltage or current to the variable resistance element 507, for example, a transistor, or a diode and the like.

The first to third interlayer dielectric layers 502 to 504 may include any single layer including oxide, nitride, or oxynitride or a stacked structure thereof.

The bottom electrode contact 503 may be formed under the variable resistance element, and serve as a path for supplying a voltage or current to the variable resistance element. The bottom electrode contact 503 may include various conductive materials, for example, metal or metal nitride.

The variable resistance element 507 may include a material having a characteristic switched between different resistance states, according to a voltage or current applied to the variable resistance element 507. The variable resistance element 507 may include various materials used for RRAM, PRAM, FRAM, or MRAM and the like. For example, the various materials may include a transition metal oxide, a metal oxide such as a perovskite-based material, a phase change material such as a chalcogenide-based material, a ferrodielectric material, or a ferromagnetic material. The variable resistance element 507 may have a single-layer structure or a multilayer structure which includes two or more layers so as to exhibit a variable resistance characteristic.

For example, the variable resistance element 507 may include a magnetic tunnel junction (MTJ) structure which includes a first magnetic layer 504, a second magnetic layer 506, and a tunnel barrier layer 505 interposed between the first and second magnetic layers 504 and 506.

The first and second magnetic layers 504 and 506 may have a single-layer structure or multilayer structure including various ferromagnetic materials, for example, Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy. Any one of the first and second magnetic layers 504 and 506 may have a variable magnetization direction and serve as a free layer or storage layer, and the other of the first and second magnetic layers 504 and 506 may have a pinned magnetization direction and serve as a pinned layer or reference layer. The tunnel barrier layer 505 may change the magnetization direction of the free layer through electron tunneling. The tunnel barrier layer 505 may have a single-layer structure or multilayer structure including an oxide such as $Al_2O_3$, MgO, CaO, SrO, TiO, VO, or NbO.

When the magnetization directions of the first and second magnetic layers 504 and 506 are parallel to each other, the variable resistance element 507 may be set in a low-resistance state, and store data '0', for example. On the other hand, when the magnetization directions of the first and second magnetic layers 504 and 506 are anti-parallel to each other, the variable resistance element 507 may be set in a high-resistance state, and store data '1', for example. The variable resistance element 507 may further include various layers for securing the characteristic of the MTJ structure, in addition to the MTJ structure.

In another example, the variable resistance element 507 may include a metal oxide which contains oxygen vacancies of which the resistance can be changed through the behavior of the oxygen vacancies.

The top electrode contact 508 may serve to electrically couple the first metal wiring 512 and the variable resistance element 507, and simultaneously serve as an electrode for the variable resistance element 507. The top electrode contact 508 may be formed of or include the same material as the bottom electrode contact 503.

The source line contact 510 may be formed between the variable resistance elements 507, and electrically couple the switching element and the second metal wiring 513. The source line contact 510 may be arranged so as to deviate from a plurality of variable resistance elements 507 by a predetermined distance.

The barrier layer 511 may be simultaneously formed on the top electrode contact 508 and the source line contact 510. The barrier layer 511 may serve as a seed layer for depositing the first and second metal wirings 512 and 513, and serve as an anti-diffusion layer for preventing diffusion of the first and second metal wirings 512 and 513. The barrier layer 511 may include a metal material. The barrier layer 511 may include tantalum, for example. The barrier layer 511 may be buried in the second interlayer dielectric layer 509, and surround the bottom and a part of the sidewall of the first and second metal wirings 512 and 513.

The first and second metal wirings 512 and 513 may be partially embedded in the barrier layer 511, and formed in a line type so as to be in contact with the top electrode contact 508 and the source line contact 510, respectively. The first and second metal wirings 512 and 513 may be formed on the same line so as to be spaced at a predetermined interval from each other.

In the fifth implementation, since the barrier layer 511 is locally formed only at the bottoms of the first and second metal wirings 512 and 513, it is possible to minimize the increase in resistance of the metal wiring depending on the thickness of the barrier layer. Although the electronic device of FIG. 6 has been illustrated that the barrier layer has the structure of FIG. 1, present implementation is not limited thereto. For example, the electronic device may include the structures of the barrier layer and the metal wiring, illustrated in FIGS. 2 to 4.

FIGS. 7A to 7J are cross-sectional views illustrating a method for fabricating the semiconductor device in accordance with the fifth implementation.

Figure 7A:
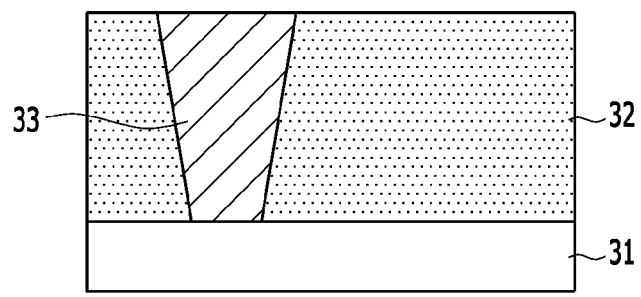
FIGS. 7A through 7J are cross-sectional views illustrating an example of a method for fabricating the semiconductor device in accordance with the fifth implementation.

As illustrated in FIG. 7A, a substrate 31 having a predetermined structure formed therein may be prepared, the predetermined structure including a switching element (not illustrated) and the like. The switching element may serve to select a specific unit cell from a plurality of unit cells included in a semiconductor device, and include a transistor, or a diode and the like. One end of the switching element may be electrically coupled to a bottom electrode contact to be described below, and the other end of the switching element may be electrically coupled to a source line through a source line contact to be described below.

Then, a first interlayer dielectric layer 32 may be formed over the substrate 31. The first interlayer dielectric layer 32 may include any single layer including oxide, nitride, or oxynitride or a stacked structure thereof.

A contact hole (not illustrated) may be formed to expose the substrate 31 through the first interlayer dielectric layer 32. The contact hole may be formed through the following process: a mask pattern (not illustrated) is formed over the first interlayer dielectric layer 32 and the first interlayer dielectric layer 32 is etched using the mask pattern as an etch barrier such that the substrate 31 is exposed.

Then, a bottom electrode contact 33 may be buried in the contact hole. The bottom electrode contact 33 may serve to couple the substrate 31 to a variable resistance element that will be formed in a subsequent process. The bottom electrode contact 33 may be formed through the following series of processes: a conductive material is formed on the surface of the resultant structure so as to fill the contact hole, an isolation process is performed to electrically isolate the adjacent bottom electrode contacts 33 from one another, and the conductive material is recessed by a predetermined thickness. The isolation process may be performed by etching or polishing the conductive material formed on the surface using a blanket etch process (for example, etch-back process) or a chemical mechanical polishing process, until the first interlayer dielectric layer 32 is exposed. The bottom electrode contact 33 may include a semiconductor layer or metallic layer.

Figure 7B:
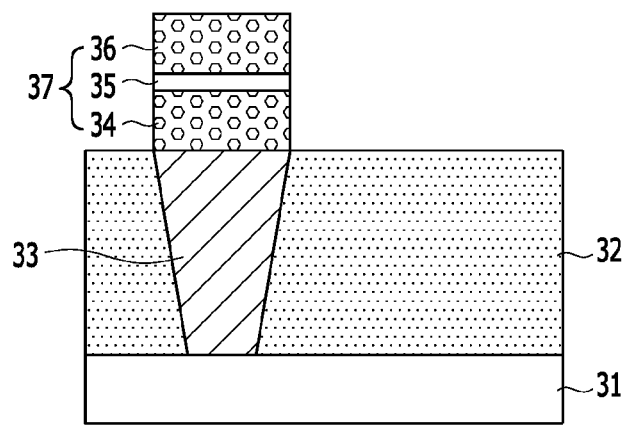

As illustrated in FIG. 7B, a variable resistance element 37 may be formed over the bottom electrode contact 33. FIG. 7B illustrates that the variable resistance element 37 has the same CD as the bottom electrode contact 33. However, other implementations are also possible. For example, the CD of the variable resistance element 37 may be adjusted to be greater or smaller than the CD of the bottom electrode contact 33. The variable resistance element 37 may further include an electrode layer (not illustrated) at the top and bottom thereof.

The variable resistance element 37 may have a characteristic switched between different resistance states (or different resistance values), according to a bias applied through the top electrode or/and bottom electrode (for example, voltage or current). Such a characteristic allows the variable resistance element 37 to be utilized in various fields. For example, the variable resistance element 37 may be used as a data storage for storing data.

The variable resistance element 37 may exhibit a variable resistance characteristic through a bias applied through the top electrode or/and bottom electrode. For example, the variable resistance element 37 may include a phase change material. The phase change material may include a chalcogen compound. The phase change material may change to an amorphous state or crystal state according to an external stimulus (for example, voltage or current), and have a characteristic of switching between different resistance states. Furthermore, the variable resistance element 37 may include a metal oxide. The metal oxide may include a transition metal oxide (TMO), or a perovskite-based oxide and the like. The metal oxide may contain vacancies therein, and have a characteristic switched between different resistance states through formation and disappearance of a conductive path depending on the behavior of the vacancies, caused by an external stimulus. Furthermore, the variable resistance element 37 may have a stacked structure including two magnetic layers 34 and 36 and a tunnel barrier layer 35 interposed therebetween. The stacked structure having the tunnel barrier layer interposed between the two magnetic layers may be referred to as a magnetic tunnel junction (MTJ). For example, when the magnetization directions of the two magnetic layers 34 and 36 are equal to each other (or parallel to each other), the variable resistance element 37 may have a low resistance state, and when the magnetization directions of the two magnetic layers 34 and 36 are different from each other (or anti-parallel to each other), the variable resistance element 37 may have a high resistance state. However, the present implementation is not limited thereto, and the variable resistance element 37 may include any materials as long as they can satisfy a variable resistance characteristic switched between different resistance states according to a bias applied to the top electrode or/and bottom electrode thereof.

Then, a spacer (not illustrated) may be formed on the sidewalls of the variable resistance element 37.

Figure 7C:
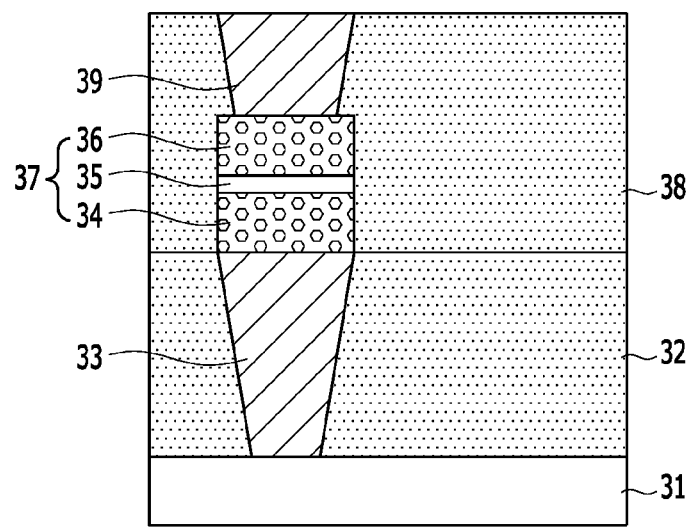

As illustrated in FIG. 7C, a second interlayer dielectric layer 38 may be formed over the first interlayer dielectric layer 32. The second interlayer dielectric layer 38 may be formed with a sufficient thickness to fill the space between the variable resistance elements 37. For example, the second interlayer dielectric layer 38 may be formed in such a manner that the top surface of the second interlayer dielectric layer 38 is set at a higher level than the top surface of the variable resistance element 37. The height of the second interlayer dielectric layer 38 may be determined in consideration of the height of a top electrode contact that will be formed in a subsequent process. The second interlayer dielectric layer 38 may be formed of or include the same material as the first interlayer dielectric layer 32. The second interlayer dielectric layer 38 may include any single layer including oxide, nitride, or oxynitride or a stacked structure thereof.

Then, a top electrode contact 39 may be formed through the second interlayer dielectric layer 38 over the variable resistance element 37, and coupled to the variable resistance element 37. The top electrode contact 39 may be formed by the following process: the second interlayer dielectric layer 38 is etched to form a contact hole exposing the top surface of the variable resistance element 37 and a conductive material is buried in the contact hole. The top electrode contact 39 may serve to electrically couple the variable resistance element 37 to a first metal wiring to be formed through a subsequence process, and simultaneously serve as an electrode for the variable resistance element 37. The top electrode contact 39 may be formed of or include the same material as the bottom electrode contact 33. For example, the top electrode contact 39 may include tungsten (W), for example.

Figure 7D:
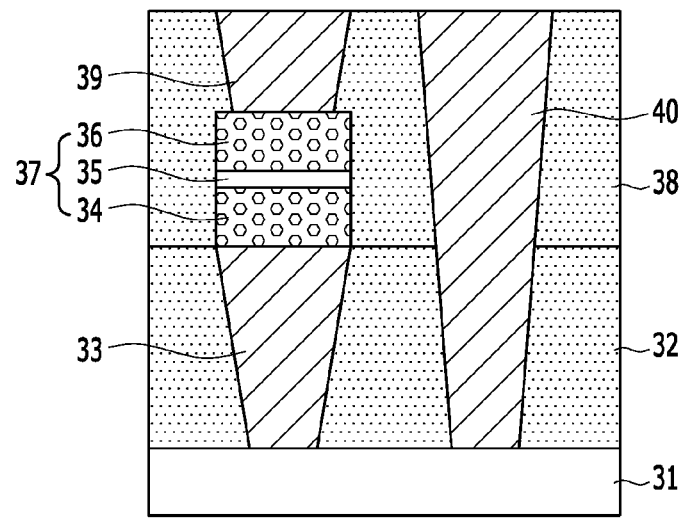

As illustrated in FIG. 7D, a source line contact 40 may be formed through the first and second interlayer dielectric layers 32 and 38 between the variable resistance elements 37 so as to be in electrically contact with the substrate. The source line contact 40 may serve to electrically couple the switching element to a second metal wire. The source line contact 40 may be arranged so as to deviate from a plurality of variable resistance elements 37 by a predetermined distance.

Figure 7E:
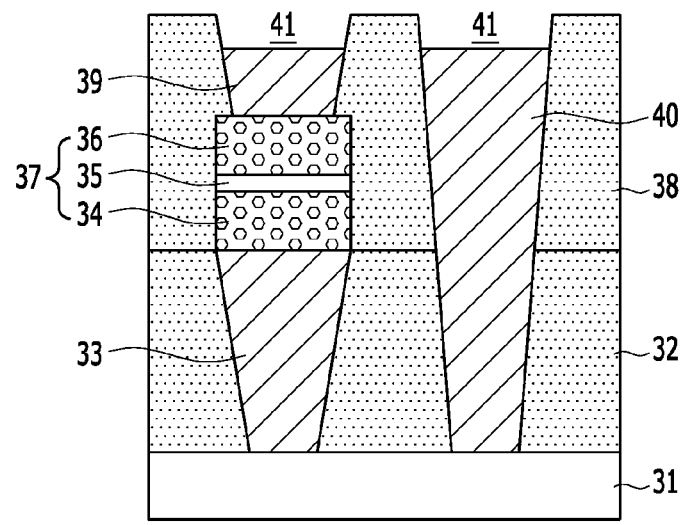

As illustrated in FIG. 7E, the top electrode contact 39 and the source line contact 40 may be partially recessed to form grooves 41. At this time, the etching process may be performed under a condition of maximizing an etch selectivity between a conductive material and an insulating material, such that the damage of the second interlayer dielectric layer 38 is minimized.

Figure 7F:
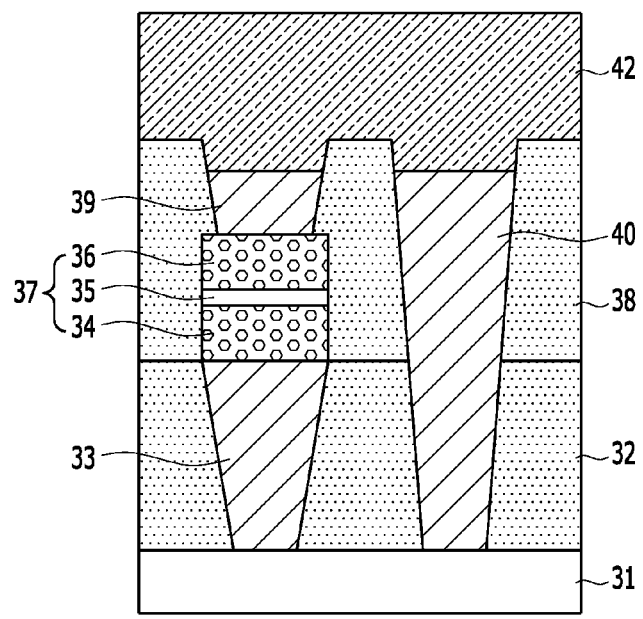

As illustrated in FIG. 7F, a mold layer 42 may be formed over the top electrode contact 39, the source line contact 40, and the second interlayer dielectric layer 38. The mold layer 42 may serve as a sacrificial layer for performing a damascene process for forming a metal wiring during a subsequent process. In the present implementation, since the mold layer 42 is formed of or includes a material capable of serving as a seed layer of the metal wiring, an additional process for a barrier layer can be omitted, thereby increasing a process margin. Thus, it is possible to prevent the reduction in CD of the metal wiring depending on the thickness of the barrier layer and to prevent the increase in resistance of the metal wiring depending on the reduction in CD of the metal wiring.

The mold layer 42 may include a conductive material. The mold layer 15 may include tantalum (Ta), for example. The mold layer 42 may not only serve as a sacrificial layer for forming the damascene structure, but also serve as a seed layer during a deposition process for the metal wiring and a barrier layer for preventing diffusion of the metal wiring.

Figure 7G:
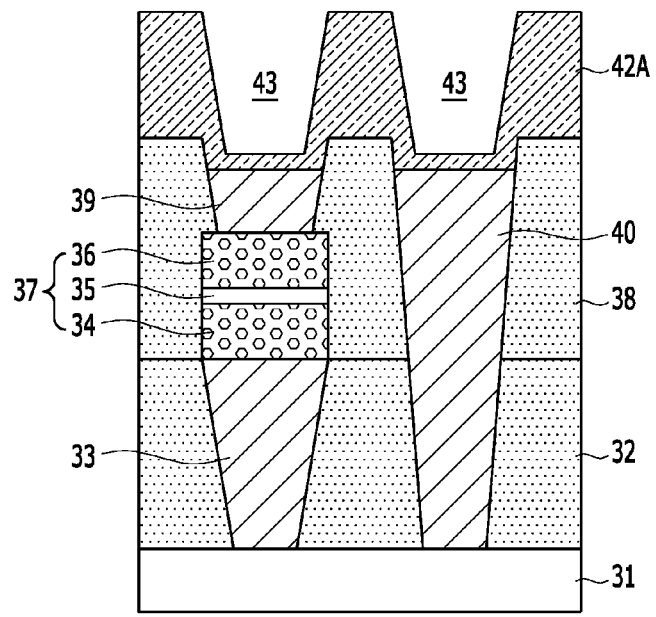

As illustrated in FIG. 7G, the mold layer 42 (refer to FIG. 7F) may be etched to form damascene structures 43. The etched mold layer will be represented by reference numeral 42A. In the present implementation, the etching target may be adjusted such that the bottom surfaces of the damascene structures 43 are positioned at a lower level than the top surface of the second interlayer dielectric layer 38.

Figure 7H:
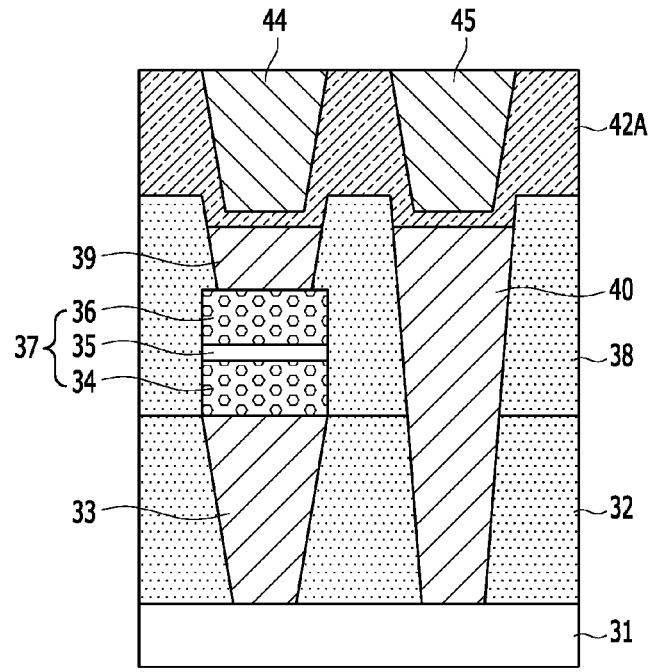

As illustrated in FIG. 7H, first and second metal wirings 44 and 45 may be buried in the damascene structure 43. The first and second metal wirings 44 and 45 may be formed through the following series of processes: a conductive material is formed on the surface of the resultant structure so as to fill the damascene structure 43, and an isolation process is performed to electrically isolate the adjacent metal wirings 44 and 45. The isolation process may be performed by etching or polishing the conductive material formed on the surface using a blanket etch process (for example, etch-back process) or a chemical mechanical polishing process, until the mold layer 42A is exposed.

The first and second metal wirings 44 and 45 may include a conductive material. For example, the first and second metal wirings 44 and 45 may include Cu. Since the mold layer 42A serves as a seed layer when the first and second metal wirings 44 and 45 are formed, the deposition process can be easily performed. Furthermore, as the mold layer 42A serves as a seed layer, a seed layer can be omitted when the first and second metal wirings 44 and 45 are formed. Thus, a process margin can be secured. In addition, since the first and second metal wirings 44 and 45 are buried in the entire damascene structure 43, it is possible to prevent the decrease of resistance depending on the area (CD) of the first and second metal wirings 44 and 45.

Figure 7I:
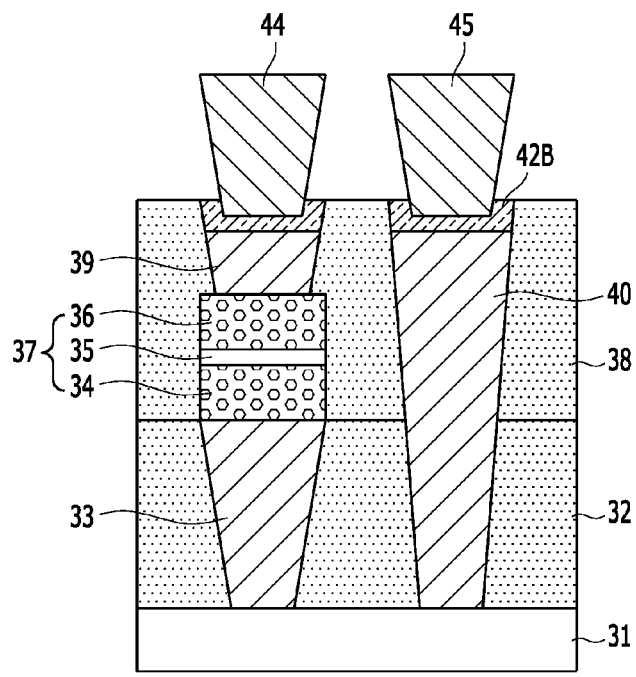

As illustrated in FIG. 7I, the mold layer 42A (refer to FIG. 7H) may be etched to form a barrier layer 42B. At this time, the etching target may be adjusted such that the top surface of the barrier layer 42B is positioned at the same level as the top surface of the second interlayer dielectric layer 38. Since the first and second metal wirings 44 and 45 have a structure that protrudes in a pillar shape and is partially embedded in the barrier layer 42B, the etching process can be stably performed and a collapse is prevented.

Since Cu applied as the first and second metal wirings 44 and 45 is a material having a great etch selectivity with respect to the mold layer, the first and second metal wirings 44 and 45 are hardly damaged when the mold layer is etched. Thus, without a mask process, the mold layer can be sufficiently etched through an etch-back process. Furthermore, since the barrier layer 42B does not reduce the regions of the first and second metal wirings 44 and 45, it is possible to minimize the decrease in resistance of the first and second metal wirings 44 and 45 due to the barrier layer 42B.

In another implementation, when the mold layer is etched, the etched material may be induced to be re-deposited. Thus, as illustrated in FIG. 2, the barrier layer 206 may also be formed on the sidewalls of the metal wiring. Furthermore, when the mold layer is etched, the metal wiring may be applied as an etch mask to form the barrier layer 306 having a thickness which gradually increases toward the bottom.

Figure 7J:
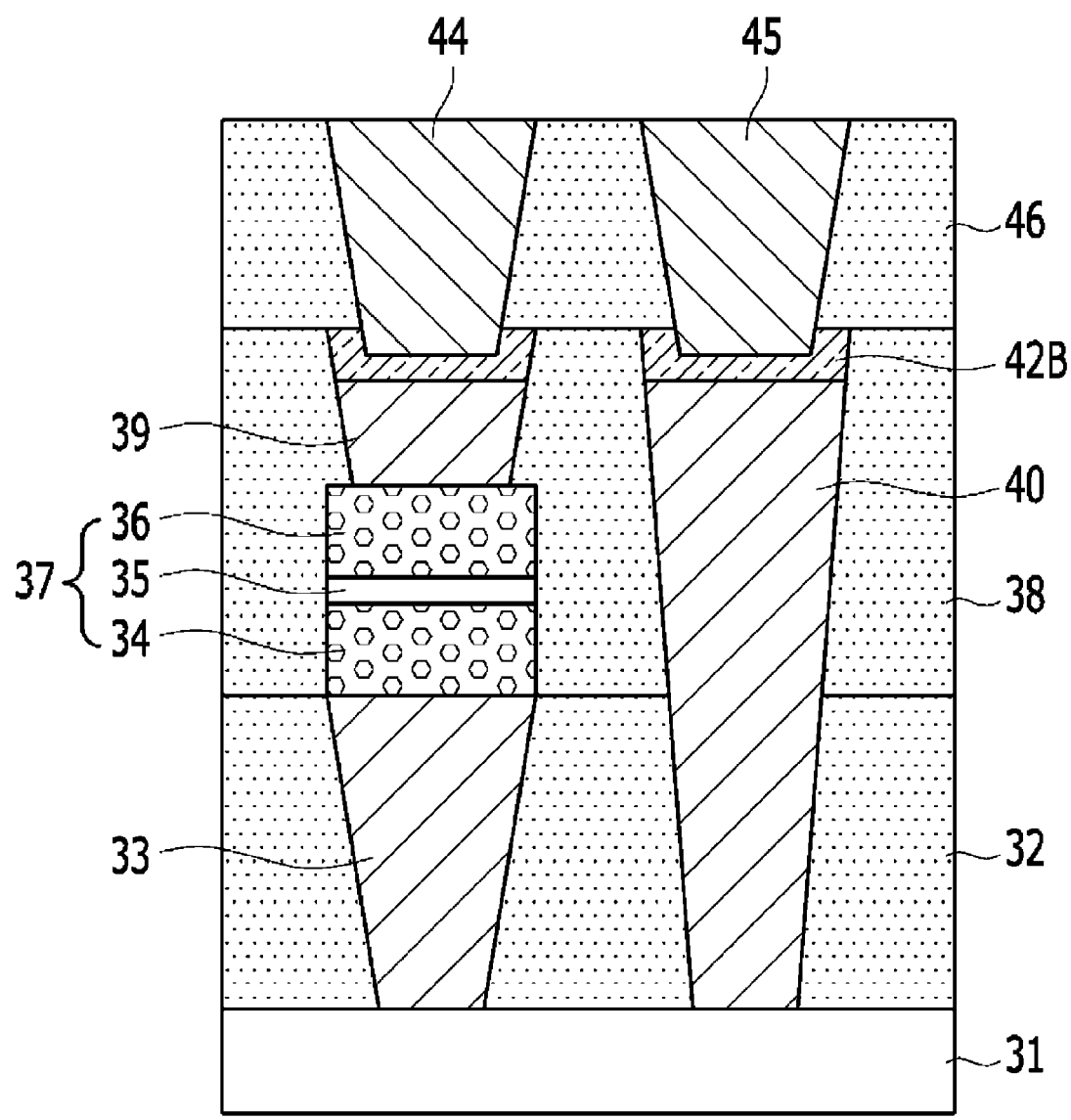

As illustrated in FIG. 7J, a third interlayer dielectric layer 46 may be buried between the first and second metal wirings 44 and 45. The third interlayer dielectric layer 46 may include the same material as the second interlayer dielectric layer 38. The third interlayer dielectric layer 46 may include an insulating material. The third interlayer dielectric layer 46 may include any single layer including oxide, nitride, or oxynitride or a stacked structure thereof.

In another implementation, when the second interlayer dielectric layer 406 is formed, a material having poor step coverage may be used to form an air gap 405 between the metal wirings 408.

In accordance with the implementations, it is possible to simplify the process and to improve the characteristic of the variable resistance element.

The above and other memory circuits or semiconductor devices based on the disclosed technology can be used in a range of devices or systems. FIGS. 8-12 provide some examples of devices or systems that can implement the memory circuits disclosed herein.

Figure 8:
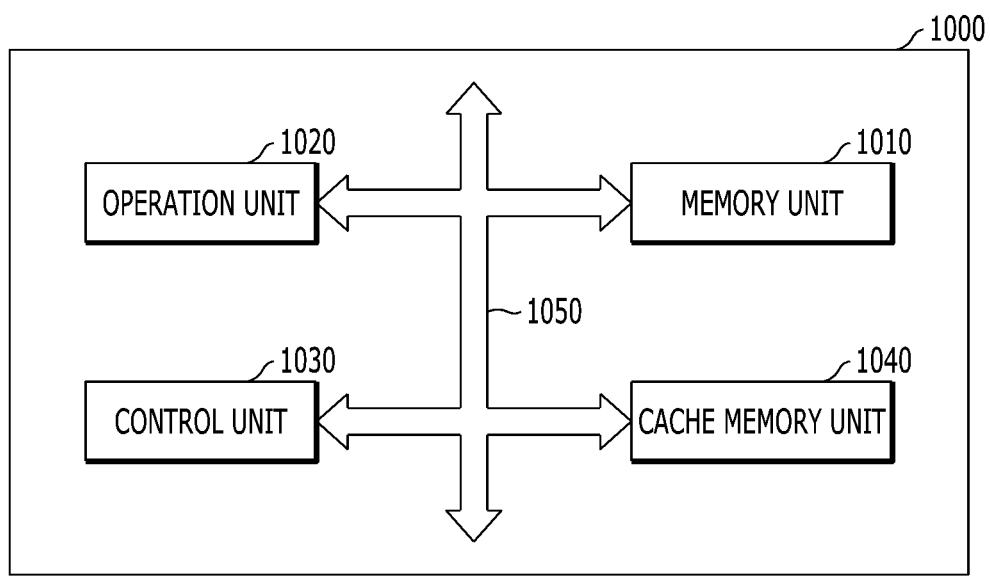
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
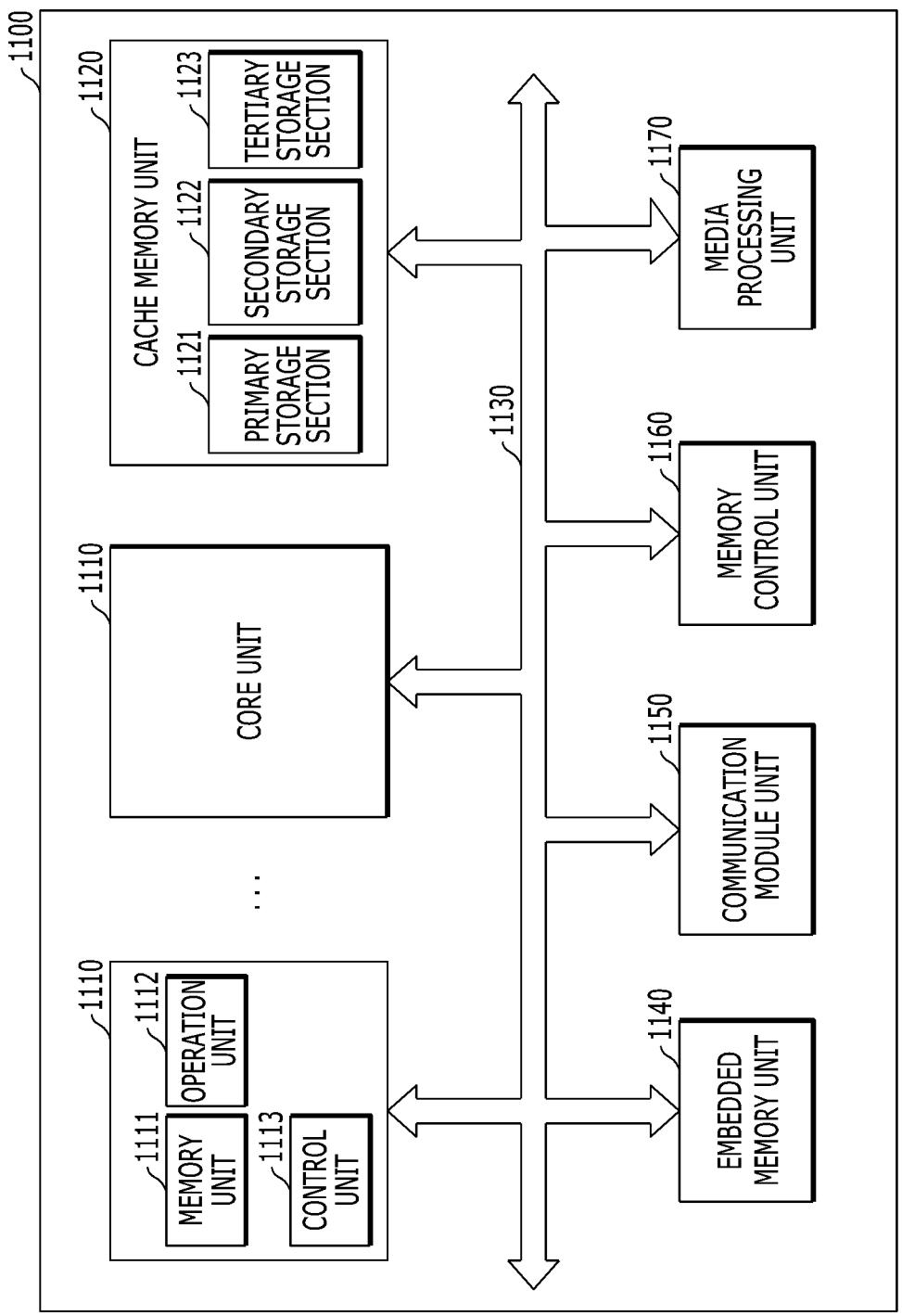
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
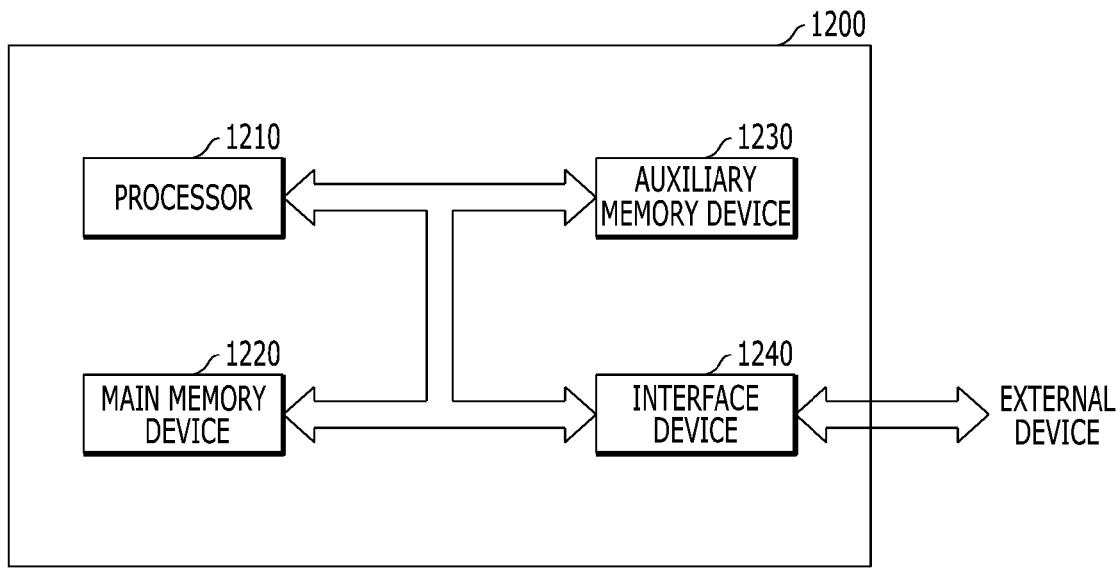
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
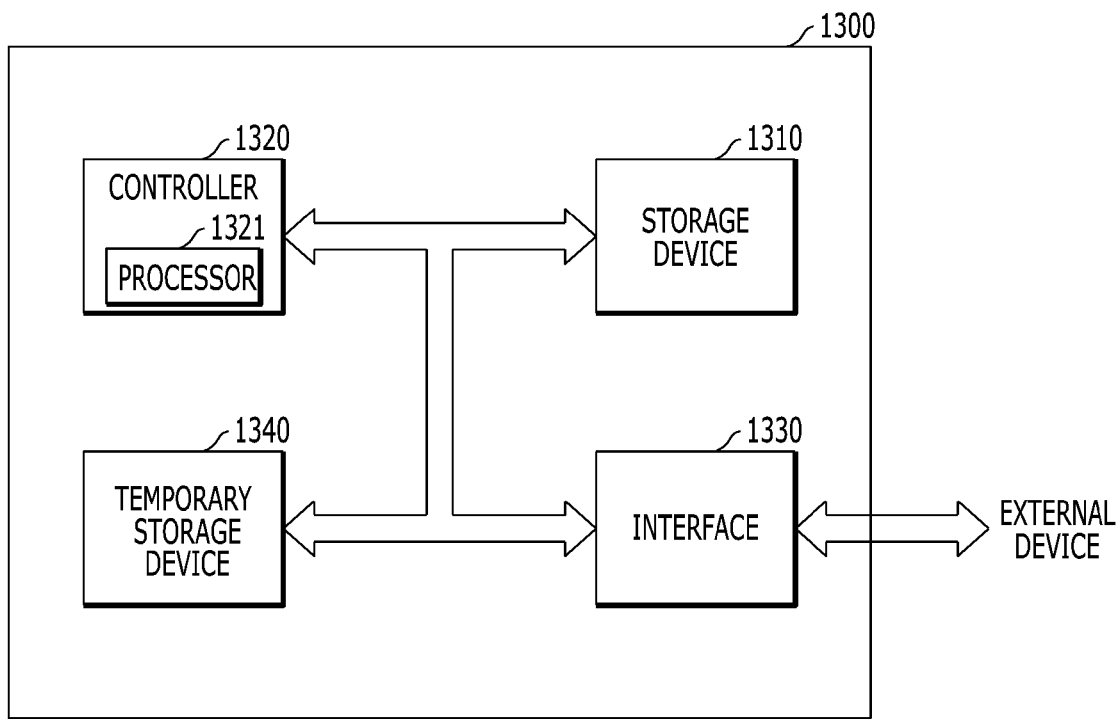
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 12:
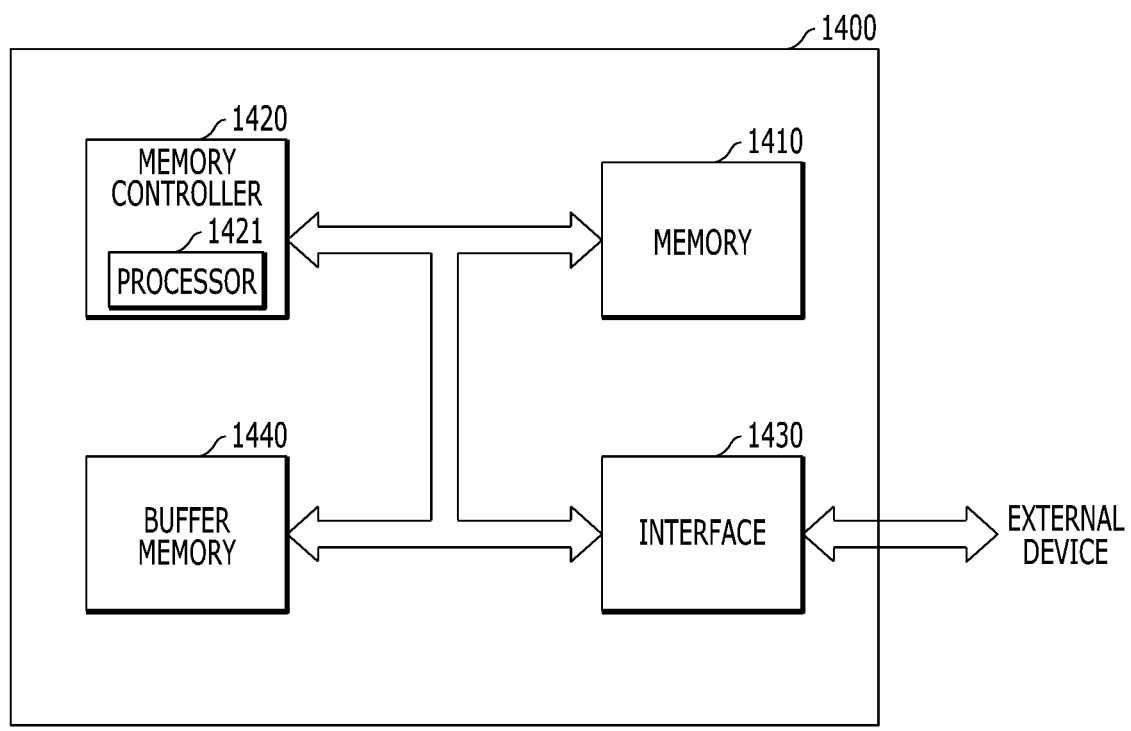
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element formed over a substrate; a top electrode formed over the variable resistance element; an interlayer dielectric layer buried between the variable resistance element and the top electrode, and including a contact hole to expose the top electrode; a barrier layer formed over the top electrode so as to fill a part of the contact hole, and having a groove; and a metal wiring connected to the groove of the barrier layer. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a substrate;
   a variable resistance element formed over the substrate;
   a top electrode formed over the variable resistance element;
   a barrier layer formed over the top electrode and including a groove that is located in an upper portion of the barrier layer and is above both the top electrode and the variable resistance element underneath the top electrode;
   an interlayer dielectric layer formed over the substrate to have a layer structure in which the variable resistance element, the top electrode and the barrier layer are formed in the interlayer dielectric layer; and
   a metal wiring including a portion formed in the groove of the barrier layer.

2. The electronic device of claim 1, wherein the barrier layer surrounds a part of the sidewall and the bottom of the metal wiring.

3. The electronic device of claim 1, wherein:
   the metal wiring, in addition to the portion formed in the groove of the barrier layer, includes a second portion formed over the interlayer dielectric layer, and
   the barrier layer includes an extension protruding above the interlayer dielectric layer to surround sidewalls of the second portion of the metal wiring.

4. The electronic device of claim 1, wherein the barrier layer comprises a metal layer.

5. The electronic device of claim 1, wherein the barrier layer comprises tantalum, and the metal wiring comprises copper.

6. The electronic device of claim 1, wherein the metal wiring, in addition to the portion formed in the groove of the barrier layer, includes a second portion formed over the interlayer dielectric layer, and
   the device further includes an insulating layer in which the second portion of the metal wiring is formed.

7. The electronic device of claim 1, further comprising an insulating layer formed over the interlayer dielectric layer and having an air gap around the metal wiring.

8. The electronic device of claim 1, further comprising a bottom electrode contact between the substrate and the variable resistance element.

9. The electronic device of claim 1, further comprising:
   a source line contact formed in the interlayer dielectric layer to be adjacent to the variable resistance element and the top electrode;
   another barrier layer formed in the interlayer dielectric layer over the source line contact, and having a groove; and
   another metal wiring including a portion formed in the groove of another barrier layer and including another portion formed over the interlayer dielectric layer.

10. The electronic device of claim 1, wherein the variable resistance element includes a first magnetic layer, a second magnetic layer, and a tunnel barrier layer interposed between the first and second magnetic layers.

11. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit that includes the resistance variable element is part of the memory unit in the microprocessor.

12. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the resistance variable element is part of the cache memory unit in the processor.

13. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

14. The electronic device according to claim 1, further comprising a data storage system which includes:
 a storage device configured to store data and conserve stored data regardless of power supply;
 a controller configured to control input and output of data to and from the storage device according to a command inputted form an outside;
 a temporary storage device configured to temporarily store data exchanged between the storage device and the outside; and
 an interface configured to perform communication between at least one of the storage device, the controller and the temporary storage device and the outside,
 wherein the semiconductor memory unit that includes the resistance variable element is part of the storage device or the temporary storage device in the data storage system.

15. The electronic device according to claim 1, further comprising a memory system which includes:
 a memory configured to store data and conserve stored data regardless of power supply;
 a memory controller configured to control input and output of data to and from the memory according to a command inputted form an outside;
 a buffer memory configured to buffer data exchanged between the memory and the outside; and
 an interface configured to perform communication between at least one of the memory, the memory controller and the buffer memory and the outside,
 wherein the semiconductor memory unit that includes the resistance variable element is part of the memory or the buffer memory in the memory system.

16. An electronic device comprising a semiconductor memory including an array of unit cells,
 wherein each unit cell comprises:
 a substrate;
 a bottom electrode contact formed over the substrate through a first interlayer dielectric layer;
 a variable resistance element formed over the first interlayer dielectric layer through a second interlayer dielectric layer and including a first magnetic layer, a second magnetic layer, and a tunnel barrier layer interposed between the first and second magnetic layers, the variable resistance element being electrically coupled to the substrate through the bottom electrode contact and exhibiting different resistance states for storing data based on magnetization directions of the first magnetic layer and the second magnetic layer;
 a top electrode contact formed over the variable resistance element in the second interlayer dielectric layer;
 a metal wiring formed over the top electrode contact to be electrically coupled to the variable resistance element through the top electrode contact; and
 a barrier layer formed over the top electrode contact and surrounding at least a portion of the metal wiring, and
 wherein the barrier layer includes a groove that is located in an upper portion of the barrier layer and is above both the top electrode contact and the variable resistance element underneath the top electrode contact.

17. The electronic device of claim 16, wherein the barrier layer is formed to surround the lower portion of the metal wiring.

18. The electronic device of claim 16, wherein the barrier layer is formed to surround the entire metal wiring.

19. An electronic device comprising a semiconductor memory including an array of unit cells,
 wherein each unit cell comprises:
 a substrate;
 a bottom electrode contact formed over the substrate through a first interlayer dielectric layer;
 a variable resistance element formed over the first interlayer dielectric layer through a second interlayer dielectric layer and including a first magnetic layer, a second magnetic layer, and a tunnel barrier layer interposed between the first and second magnetic layers, the variable resistance element being electrically coupled to the substrate through the bottom electrode contact and exhibiting different resistance states for storing data based on magnetization directions of the first magnetic layer and the second magnetic layer;
 a top electrode contact formed over the variable resistance element in the second interlayer dielectric layer;
 a metal wiring formed over the top electrode contact to be electrically coupled to the variable resistance element through the top electrode contact; and
 a barrier layer formed over the top electrode contact and surrounding at least a portion of the metal wiring, and
 wherein the barrier layer is formed to surround the entire metal wiring, and
 wherein the barrier layer has a variable thickness such that the top critical dimension of the metal wiring including the barrier layer is equal to the bottom critical dimension of the metal wiring including the barrier layer.

* * * * *